United States Patent
Huang et al.

(10) Patent No.: US 11,171,100 B2
(45) Date of Patent: Nov. 9, 2021

(54) SEMICONDUCTOR DEVICE STRUCTURE WITH PROTECTED BUMP AND METHOD OF FORMING THE SAME

(71) Applicant: Taiwan Semiconductor Manufacturing Co., Ltd., Hsinchu (TW)

(72) Inventors: Hui-Min Huang, Taoyuan (TW); Wei-Hung Lin, Xinfeng Township, Hsinchu County (TW); Wen-Hsiung Lu, Tainan (TW); Ming-Da Cheng, Taoyuan (TW); Chang-Jung Hsueh, Taipei (TW); Kuan-Liang Lai, Tainan (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/697,629

(22) Filed: Nov. 27, 2019

(65) Prior Publication Data
US 2021/0159197 A1 May 27, 2021

(51) Int. Cl.
*H01L 23/00* (2006.01)

(52) U.S. Cl.
CPC .............. *H01L 24/11* (2013.01); *H01L 24/13* (2013.01); *H01L 2224/10126* (2013.01); *H01L 2224/11002* (2013.01); *H01L 2224/11013* (2013.01); *H01L 2224/11462* (2013.01); *H01L 2224/13024* (2013.01); *H01L 2924/19041* (2013.01); *H01L 2924/19042* (2013.01); *H01L 2924/19104* (2013.01)

(58) Field of Classification Search
CPC ........... H01L 24/11; H01L 2224/11462; H01L 2224/13024
See application file for complete search history.

(56) References Cited

U.S. PATENT DOCUMENTS

| 6,326,701 B1* | 12/2001 | Shinogi | H01L 23/3114 257/797 |
|---|---|---|---|
| 2009/0309224 A1* | 12/2009 | Lin | H01L 24/12 257/758 |
| 2013/0127045 A1* | 5/2013 | Lin | H01L 24/05 257/737 |

* cited by examiner

*Primary Examiner* — Dale E Page
*Assistant Examiner* — Wilner Jean Baptiste
(74) *Attorney, Agent, or Firm* — McClure, Qualey & Rodack, LLP

(57) ABSTRACT

Structures and formation methods of a semiconductor device structure are provided. The method includes forming a seed layer to cover a first passivation layer over a semiconductor substrate. The method also includes forming a metal layer to partially cover the seed layer by using the seed layer as an electrode layer in a first plating process and forming a metal pillar bump over the metal layer by using the seed layer as an electrode layer in a second plating process. In addition, the method includes forming a second passivation layer over the metal layer, wherein the second passivation layer includes a protrusion portion extending from a top surface of the second passivation layer and surrounding the sidewall of the metal pillar bump.

20 Claims, 19 Drawing Sheets

SEMICONDUCTOR DEVICE STRUCTURE WITH PROTECTED BUMP AND METHOD OF FORMING THE SAME

BACKGROUND

The semiconductor integrated circuit (IC) industry has experienced rapid growth. Advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Several new packaging technologies have been developed to further improve the density and functionalities of semiconductor dies. For example, wafer level chip scale packaging (WLCSP) is currently widely due to low cost and relatively simple processes in comparison to other packaging technologies. In a typical WLCSP, post-passivation interconnect (PPI) lines such as redistribution lines (RDLs) are formed on passivation layers, followed by the formation of additional passivation layers and bumps.

Although existing WLCSP technologies have been generally adequate for their intended purposes, they have not been entirely satisfactory in all respects, and face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
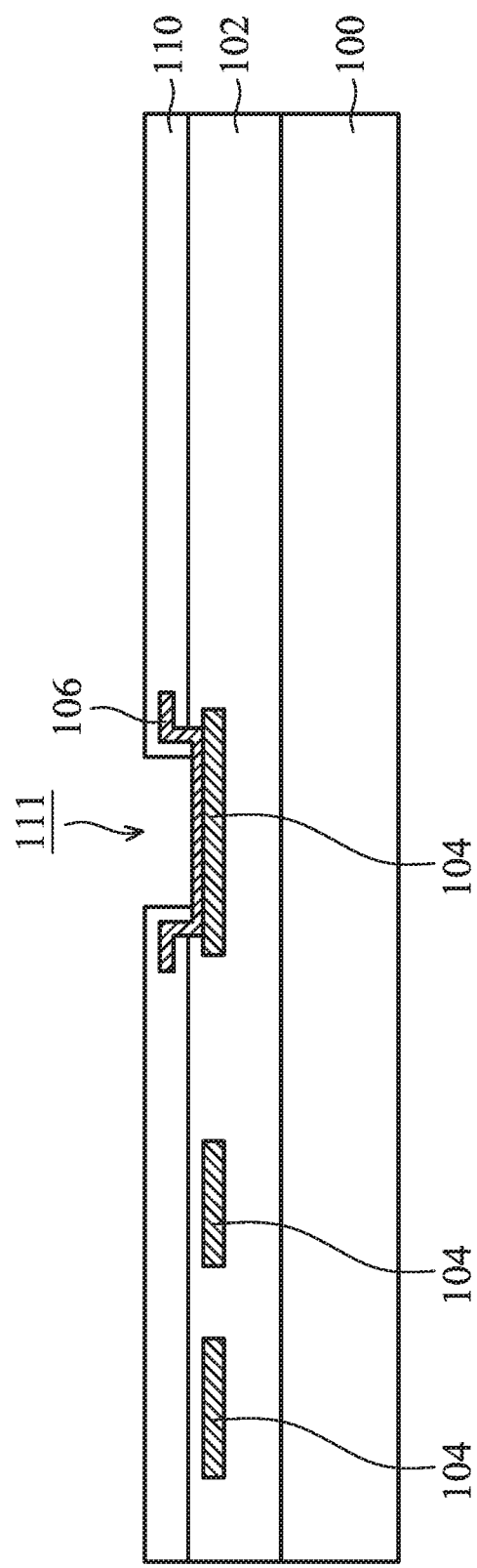
FIGS. 1A to 1H are cross-sectional views of various stages of forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A to 1H are cross-sectional views of various stages of forming a semiconductor device structure, in accordance with some embodiments. As shown in FIG. 1A, a semiconductor substrate 100 is provided. In some embodiments, the semiconductor substrate 100 is used for post passivation interconnection (PPI) fabrication. For example, the semiconductor substrate 100 is employed in a semiconductor integrated circuit fabrication, and integrated circuit devices (not shown) may be formed therein and/or thereupon. The semiconductor substrate 100 may be made of semiconductor materials, including, but is not limited to, bulk silicon, a semiconductor wafer, a silicon-on-insulator (SOI) substrate, or a silicon germanium substrate. Alternatively, other semiconductor materials including group III, group IV, and group V elements may also be used, which may include silicon germanium, silicon carbon, and/or III-V compound semiconductor materials. The integrated circuit devices as used herein refer to electronic devices, such as transistors, diodes, resistors, capacitors, inductors, and other active and passive semiconductor devices.

In some embodiments, an insulating layer 102 is formed over the semiconductor substrate 100. The insulating layer 102 may serve as an inter-dielectric (ILD) layer, an inter-metal dielectric (IMD) layer, a passivation layer or a combination thereof. To simplify the diagram, only a flat layer is depicted herein. Moreover, an interconnect structure may be formed in the insulating layer 102 and over the integrated circuit devices. The insulating layer 102 may include low-k dielectric materials, un-doped silicate glass (USG), silicon nitride, silicon oxynitride, or other common dielectric materials. The low-k dielectric materials may have a dielectric constant (k value) of less than about 3.9, or less than about 2.8. Metal lines and metal vias/contacts in the interconnect structure may be formed of copper, copper alloys or other suitable metal materials. The formation details of the interconnect structure can be realized by one skilled in the art. In addition, metal layers 104 are top metal layer formed in a top-level of the insulating layer 102, which may have an exposed surface treated by a planarization process, such as chemical mechanical polishing (CMP), if necessary.

A contact region 106, such as a metal pad, may be formed in and on the insulating layer 102 and is in direct contact with one of the metal layers 104. Suitable materials for the contact region 106 may include, but are not limited to, for example copper, aluminum, copper alloy, or other mobile conductive materials. In some embodiments, the contact region 106 serves as a bond pad region, which may be used in the bonding process to connect the integrated circuit devices in the respective chip to external features.

In some embodiments, a passivation structure 110 is formed over the semiconductor substrate 100 to cover the insulating layer 102 and the contact region 106. The passivation structure 110 may be formed of a single passivation layer or include multiple passivation layers. For example, the passivation structure 110 is formed of a single layer and is referred to as a passivation layer. In some embodiments, the passivation layer 110 is made of a non-organic material, such as silicon oxide, un-doped silicate glass (USG), silicon oxynitride, solder resist (SR), silicon nitride, silicon carbide, hexamethyldisilazane (HMDS), another suitable material, or a combination thereof. In some other embodiments, the passivation layer 110 is made of a polymer-containing material, such as epoxy, polyimide, polybenzoxazole (PBO), benzocyclobutene (BCB), silicone, acrylates, siloxane, or the like, although other relatively soft, often organic, dielectric materials can also be used. Afterwards, the passivation layer 110 is patterned to form an opening 111 exposing a portion of the contact region 106.

Multiple deposition, coating, and/or etching processes may be used to form the passivation layer 110 with the opening 111. For example, a chemical vapor deposition (CVD) process or a spin coating process may be used to form the passivation layer 110. Afterwards, an etching process, such as a dry etching process, may be used to form the opening 111.

Figure 1B:
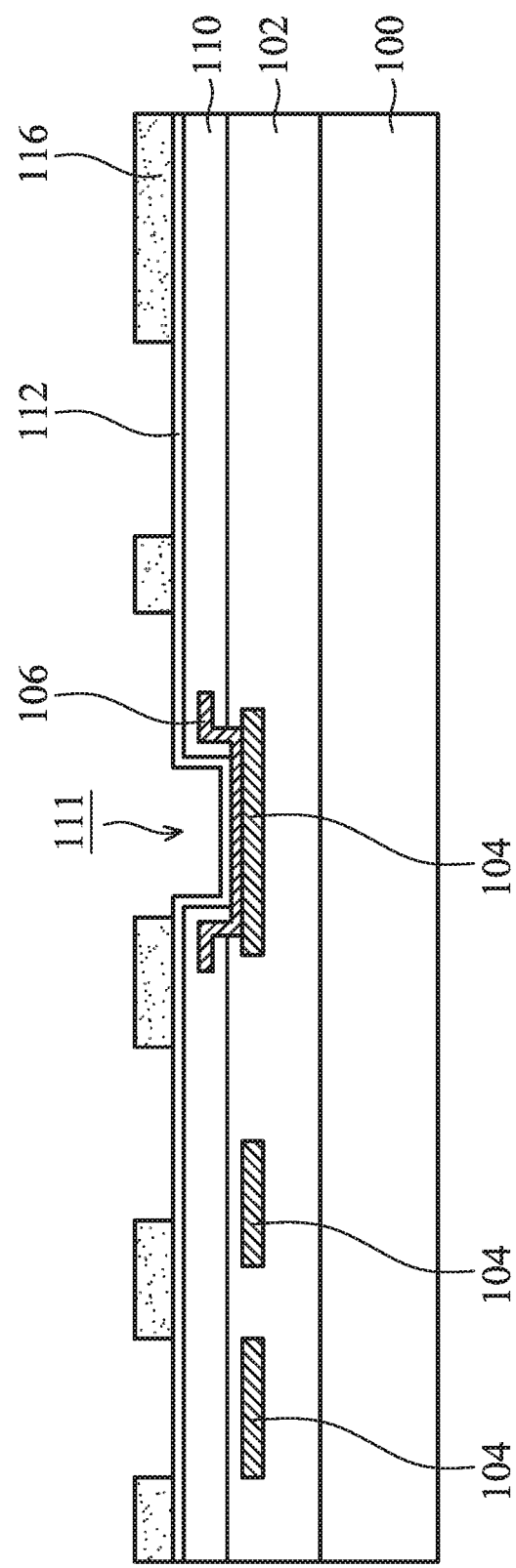
Figure 1C:
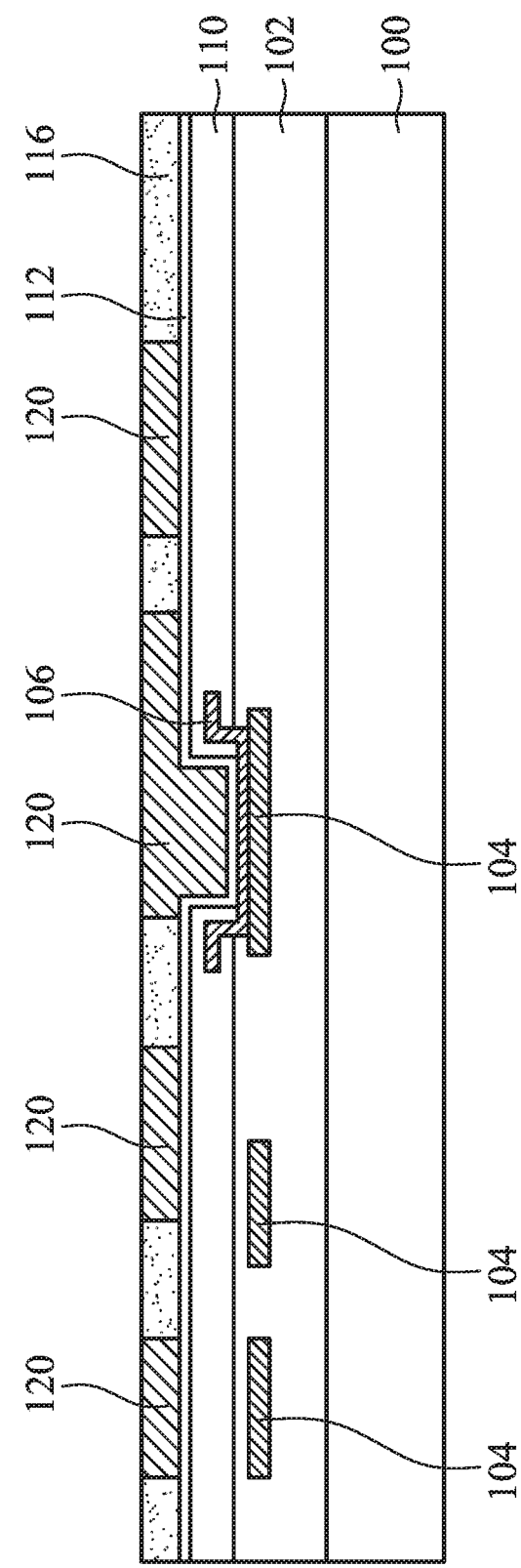

FIGS. 1B and 1C illustrate the formation of a post-passivation interconnect (PPI) layer including one or more metal layers 120 (as indicated in FIG. 1C), in accordance with some embodiments. The PPI layer (which is sometimes referred to as a redistribution line (RDL) or an interconnect layer) is such named since the formation of PPI layer is after the formation of passivation layer 110. The PPI layer including one or more metal layers 120 is electrically connected to the contact region 106 (e.g., metal pad) through the opening 111 (as indicated in FIG. 1B) in the passivation layer 110.

As shown in FIG. 1B, a seed layer 112 conformally covers the top surface of the passivation layer 110 and extends on the sidewall and the bottom of the opening 111 of the passivation layer 110, so as to be in contact with the top surface of the contact region 106 in the opening 111. In some embodiments, the seed layer 112 is made of a metal material. For example, the metal material may be made of or include titanium (Ti), Ti alloy, copper (Cu), or Cu alloy that include silver, chromium, nickel, tin, gold, and combinations thereof. Alternatively, the seed layer 112 includes multiple sub-layers. In some embodiments, the seed layer 112 is deposited using a physical vapor deposition (PVD) process (such as a sputtering process), a chemical vapor deposition (CVD) process, a spin coating process, another applicable process, or a combination thereof.

Afterwards, a patterned masking layer 116 is formed over the seed layer 112 to assist in the subsequent formation of the metal layers 120 (as indicated in FIG. 1C). The patterned masking layer 116 includes multiple openings that expose portions of the seed layer 112. Those openings of the patterned masking layer 116 define positions for the subsequent formed metal layers 120. In some embodiments, the masking layer 116 is made of a photoresist material (such as a dry film or a photoresist film) and is patterned by a lithography process.

As shown in FIG. 1C, those openings of the patterned masking layer 116 are partially or fully filled with a conductive material layer. In some embodiments, a metal layer (such as a copper (Cu) layer) is formed over the seed layer 112 to partially fill each of the openings of the patterned masking layer 116, so that metal layers 120 are partially cover the seed layer 112. As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation method may include sputtering, printing, plating, electroless plating, and commonly used chemical vapor deposition (CVD) methods. In some embodiments, a plating process, for example, an electro-chemical plating (ECP) process is carried out by using the seed layer 112 below the metal layers 120 as an electrode layer, so as to form the metal layers 120.

Figure 1D:
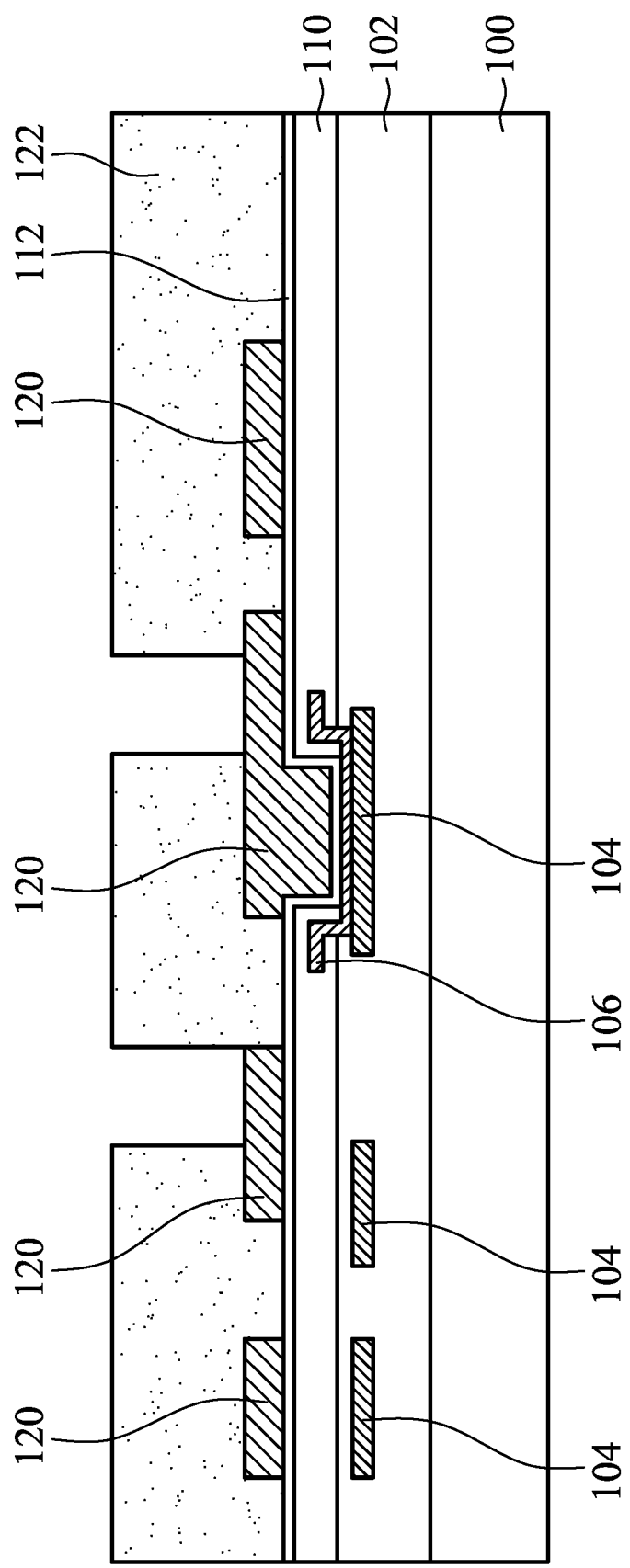
Figure 1E:
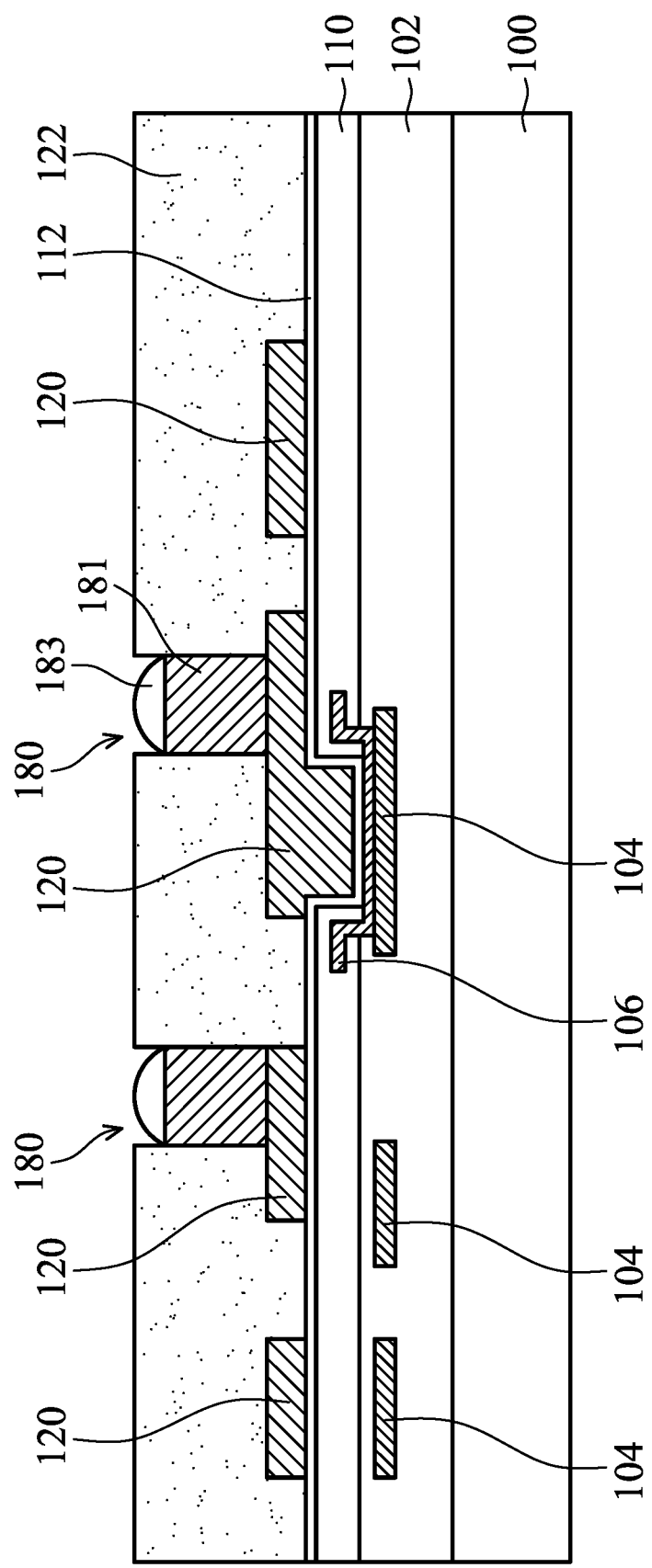

FIGS. 1D and 1E illustrate the formation of a conductive bump structure 180 including a metal pillar bumps 181 and a contact region 183 (as indicated in FIG. 1E), in accordance with some embodiments. As shown in FIG. 1D, the patterned masking layer 116 is removed to expose the seed layer 112 and the metal layers 120. For example, the patterned masking layer 116 is made of a dry film, and it may be removed using an alkaline solution. If the patterned masking layer 116 is made of photoresist, it may be removed using acetone, n-methyl pyrrolidone (NMP), dimethyl sulfoxide (DMSO), aminoethoxy ethanol, and the like. Afterwards, a patterned masking layer 122 is formed over the seed layer 112 and the metal layers 120 to assist in the subsequent formation of the metal pillar bumps 181 (as indicated in FIG. 1E). Similar to the patterned masking layer 116 shown in FIG. 1C, the patterned masking layer 122 includes multiple openings that expose portions of the metal layers 120. Those openings of the patterned masking layer 122 define positions for the subsequent formed metal pillar bumps 181. The material, the patterning method, the removal of the masking layer 122 may be the same as or similar to those of the masking layer 116.

As shown in FIG. 1E, those openings of the patterned masking layer 122 are partially or fully filled with a conductive material layer. In some embodiments, a metal layer (such as a copper (Cu), gold (Au) or silver (Ag) layer) is formed over each of the metal layers 120 to partially fill each of the openings of the patterned masking layer 122. In some embodiments, a plating process, for example, an electro-chemical plating (ECP) process is carried out by using the seed layer 112 below the metal layers 120 as an electrode layer, so as to form the metal pillar bumps 181. In those cases, the metal pillar bump 181 and the metal layer 120 under the correspondingly metal pillar bump 181 are formed by using the same electrode layer (i.e., the seed layer 112) for respective plating processes. Accordingly, the formations of the metal pillar bump 181 and the metal layer 120 can be simplified, thereby reducing the fabrication cost and processing time of the subsequent formed semiconductor device structure.

Afterwards, the contact region 183 is formed over a corresponding metal pillar bump 181, in accordance with some embodiments. In some embodiments, contact region 183 is a metal contact region, which includes a solder material layer and is formed in a plating process. For example, the plating of the solder material layer may be similar to the formation of the metal layer 120 or the metal pillar bump 181. Afterwards, the contact region 183 may then go through a reflow process, so as to form the conductive bump structure 180 in each opening of the patterned masking layer 122. The formed conductive bump structure 180 serves as an external connector for external conductive feature (not shown).

In some other embodiments, the external connector includes a non-reflowable metal pillar (e.g., the metal pillar bump 181), which may be a copper pillar. Additional capping layers such as a nickel layer, a solder cap, a palladium layer, and the like, may also be formed on this metal pillar.

Figure 1F:
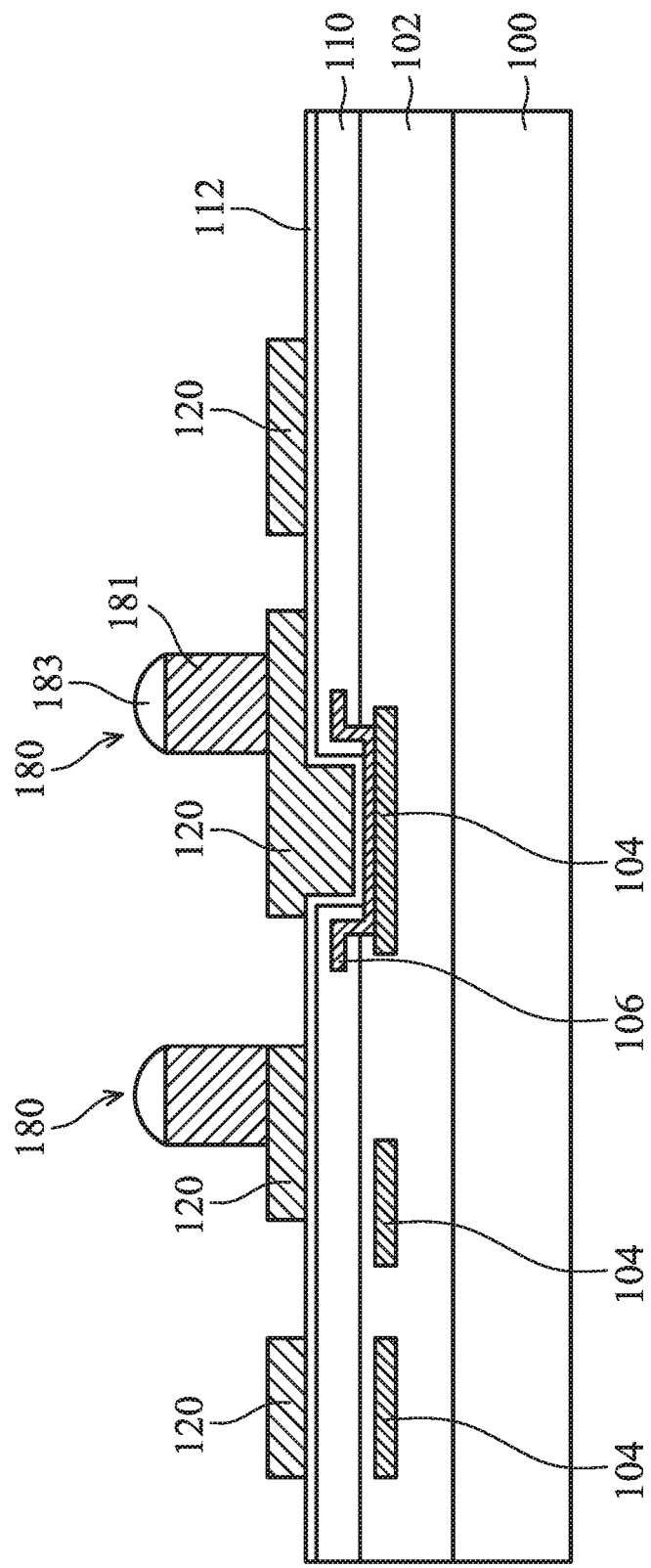

Similarly, the patterned masking layer 122 is removed to expose the seed layer 112, the metal layers 120, and the conductive bump structure 180, as shown in FIG. 1F in accordance with some embodiments. The method for removal of the patterned masking layer 122 can be the same as or similar to that of the patterned masking layer 116.

Figure 1G:
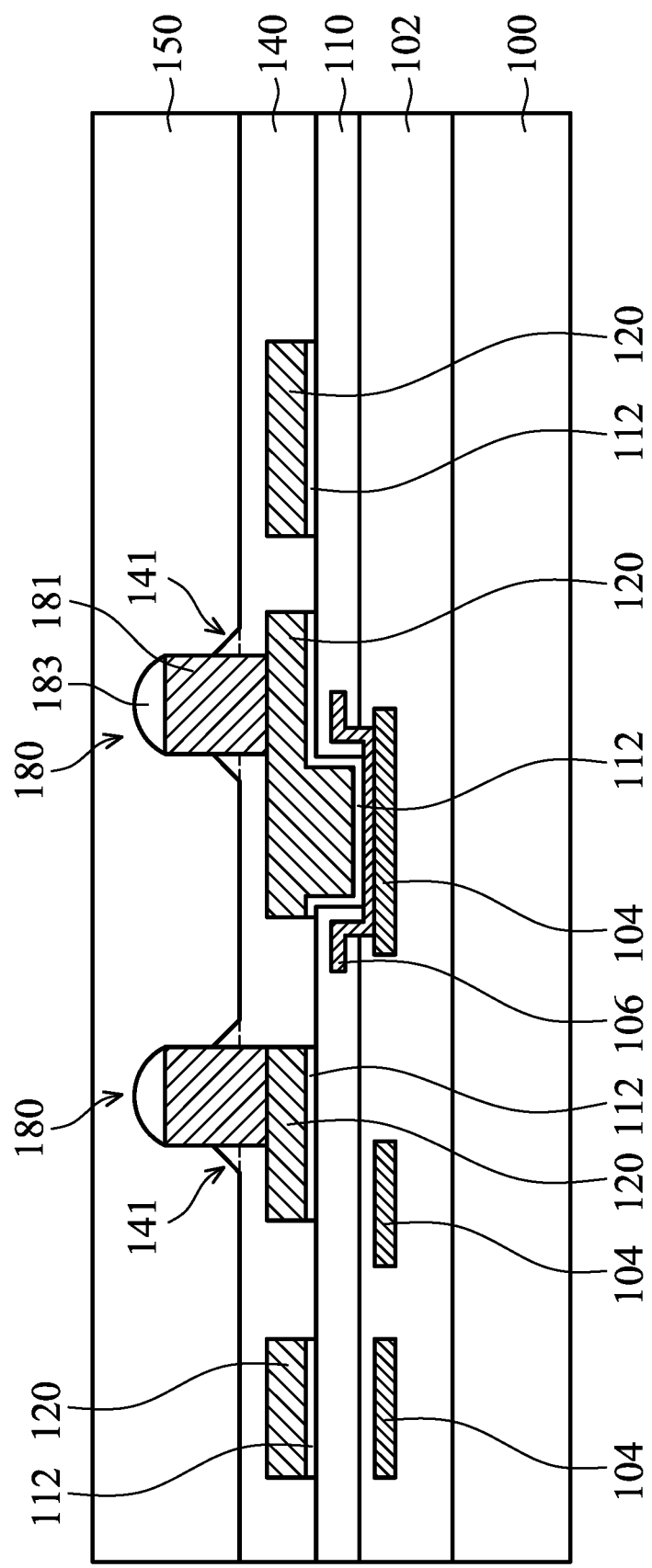
Figure 1H:
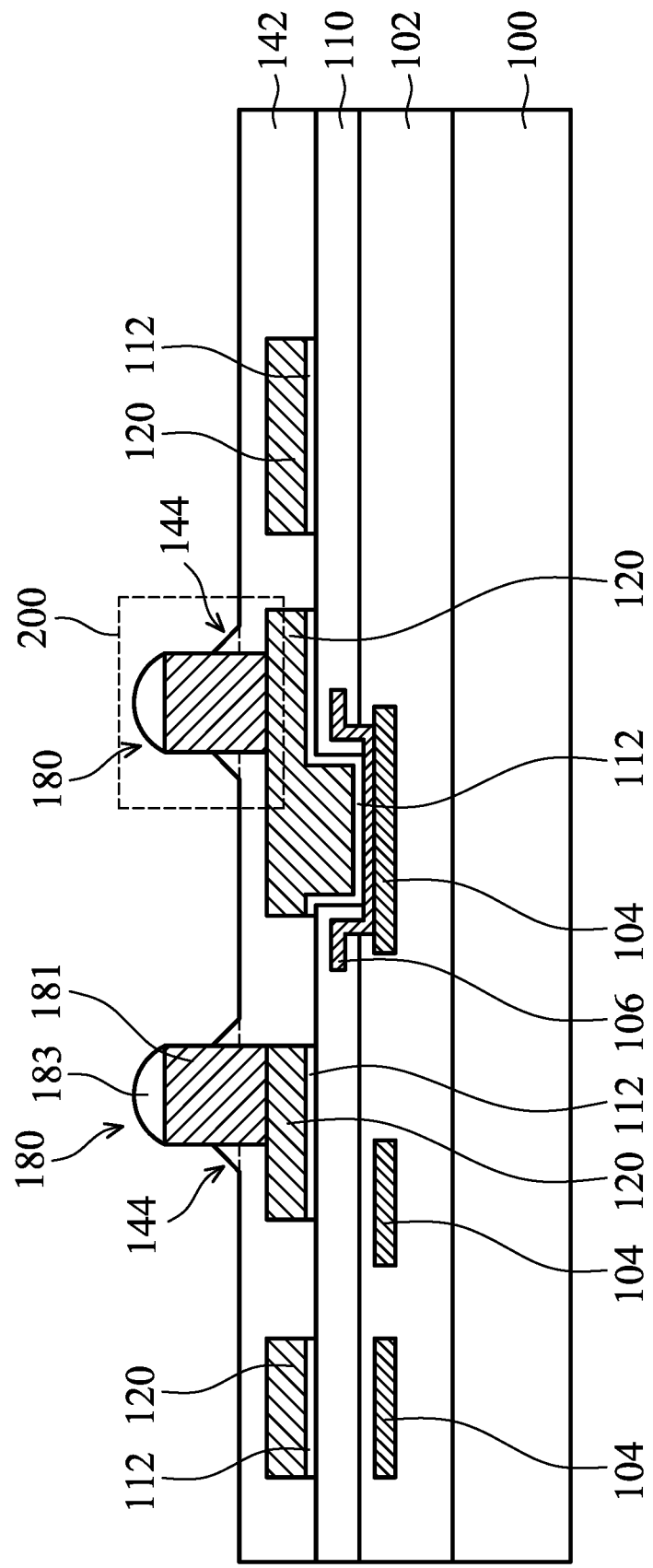

FIGS. 1G and 1H illustrate the formation of a passivation layer 142 that serves an insulating protective structure for the conductive bump structure 180, in accordance with some embodiments. As shown in FIG. 1G, the exposed portions of the seed layer 112 that are uncovered by the metal layers 120 are removed by an etching process, so as to expose the passivation layer 110, in accordance with some embodiments.

Afterwards, the exposed passivation layer 110, the metal layers 120, and the conductive bump structure 180 are covered by a polymer-containing material 140 (not shown), so that the polymer-containing material 140 extends into the gaps between the metal layers 120. As a result, the sidewalls of the metal layers 120 and the sidewalls of the conductive bump structure 180 are surrounded by the polymer-containing material 140. In some embodiments, the polymer-containing material 140 includes epoxy, polyimide, benzocyclobutene (BCB), polybenzoxazole (PBO), silicone, or the like. In some embodiments, the polymer-containing material 140 is formed using a spin coating process.

After the polymer-containing material 140 is formed, a tape layer 150 is formed over the polymer-containing material 140 to cover the contact region 183 (i.e., the solder material layer), and the metal pillar bump 181, in accordance with some embodiments. Afterwards, a pressing process is performed on the tape layer 150 to assist the tape layer 150 and the underlying polymer-containing material 140 adhered onto the structure shown in FIG. 1F, in accordance with some embodiments. In some embodiments, the tape layer 150 also serves as a temporary carrier tape used for an optional backside grinding process to thin the semiconductor substrate 100, if necessary.

During the pressing process, the polymer-containing material 140 using the tape layer as a buffer layer, so that the polymer-containing material 140 is deformed and the thickness of the polymer-containing material 140 is reduced. As a result, a protrusion portion 141 extending from a top surface of the polymer-containing material 140 is formed to surround the sidewall of the conductive bump structure 180.

After the pressing process is carried out to form the thinned and deformed polymer-containing material 140, the tape layer 150 is removed from the structure shown in FIG. 1G, as shown in FIG. 1H in accordance with some embodiments. The tape layer 150 may be removed using a light irradiation operation, a thermal operation, another applicable operation, or a combination thereof, so as to expose the polymer-containing material 140.

Afterwards, the exposed polymer-containing material 140 is cured to form a passivation layer 142 with a protrusion portion 144 that provides a protection for the sidewall of the conductive bump structure 180. In some embodiments, the curing process for the formation of the passivation layer 142 is performed at a temperature in a range from about 150° C. to about 350° C., with a duration in a range from about 20 minutes to about 150 minutes. The curing process may be performed using an oven, a hot plate, and combinations thereof. The curing step results in a full solidification of polymer-containing material 140 (i.e., the passivation layer 142) and the stability of its chemical property.

After the curing process is performed, residue (not shown) may be left on the exposed surfaces, which includes the top surface of the passivation layer 142 and the top surface of the conductive bump structure 180. A descum step, such as a plasma ashing process is then performed to remove residue, in accordance with some embodiments. For example, the plasma ashing process is performed in an oxygen-containing or fluorine-containing environment (a chamber, for example), in which an oxygen-containing or fluorine-containing gas is used as a process gas. The oxygen-containing process gas may include oxygen (O2), ozone (O3), or combinations thereof. The fluorine-containing gas may include tetrafluoromethane (CF4), sulfur hexafluoride (SF6), or a combination thereof. The duration of the plasma ashing process may be long enough, so that substantially an entirety of residue 40 is removed. In some exemplary embodiments, the duration of the plasma ashing process is in a range from about 25 seconds to 3000 seconds. After the removal of residue, the conductive bump structure 180 with a sidewall protective structure (i.e., the passivation layer 142 with the protrusion portion 144) is obtained, thereby accomplishing a semiconductor device structure with high reliability and electrical performance. Since the polymer-containing material 140 extends into the gaps between the metal layers 120, the sidewalls of the metal layers 120 and the conductive bump structure 180 are covered by a single layer (e.g., the second passivation layer 142). As a result, the delamination between the metal layers and the passivation layer 142 can be prevented. Moreover, the process cost and the process time for formation of the passivation layer can be simplified compared to the formation of the conventional passivation structure with multiple layers.

Figure 2A:
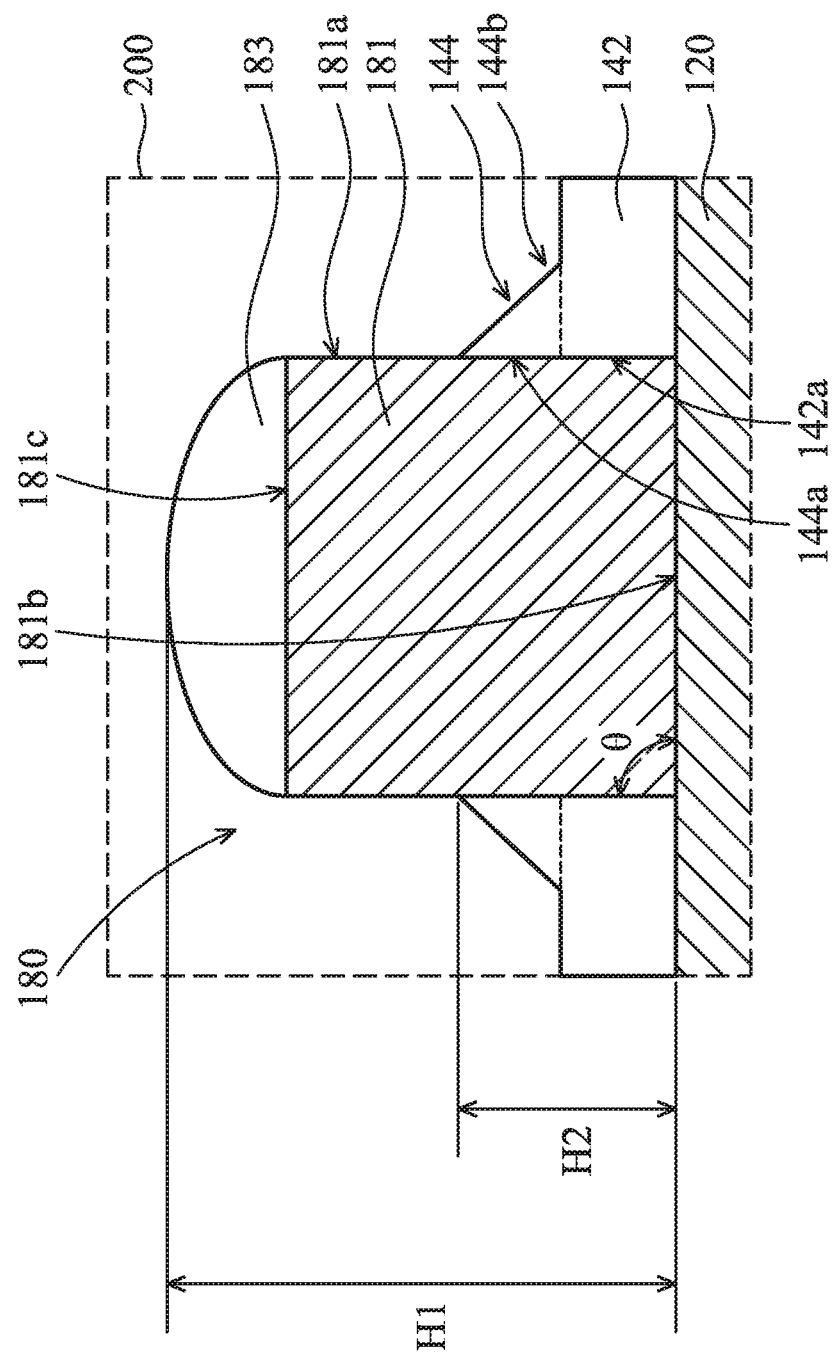
FIG. 2A is an enlarged cross-sectional view of the region 200 in FIG. 1H, in accordance with some embodiments.

FIG. 2A is an enlarged cross-sectional view of the region 200 in FIG. 1H, in accordance with some embodiments. As shown in FIG. 2A, the conductive bump structure 180 includes a metal pillar bumps 181 and a contact region 183 (e.g., a solder material layer). Since the metal pillar bump 181 and the metal layer 120 under the metal pillar bump 181 are formed by using the same seed layer 112 (as indicated in FIG. 1E) for respective plating processes, the metal pillar bump 181 is in direct contact with the metal layer 120.

Moreover, since the metal pillar bump 181 is formed prior to the formation of the passivation layer 142, a sidewall 181a of the metal pillar bump 181 has a linear profile extending from a bottom surface 181b of the metal pillar bump 181 to a top surface 181c of the metal pillar bump 181. Therefore, the protrusion portion 144 and a portion of the passivation layer 142 below the protrusion portion 144 that surround the sidewall 181a of the metal pillar bump 181 respective have sidewalls 144a and 142a with a linear profile. As a result, the sidewall 144a of the protrusion portion 144 is aligned with the sidewall 181a of the metal pillar bump 181 and the sidewall 142a of the passivation layer 142 below the protrusion portion 144. In this case, the interface between the metal pillar bump 181 and the protrusion portion 144 and the interface between the metal pillar bump 181 and a portion of the passivation layer 142 below the protrusion portion 144 are aligned with each other and extend in the same direction.

In addition, since the polymer-containing material 140 is pressed during the formation of the passivation layer 142, the formed protrusion portion 144 also has a sidewall 144b with a tapered profile.

The protrusion portion 144 prevents the sidewall 181a of the metal pillar bump 181 from damage due to the stress induced in subsequent processes. As shown in FIG. 2A, the conductive bump structure 180 has a height H1, and the passivation layer 142 with the protrusion portion 144 has a maximum height H2 (which is a height measured from the bottom of the passivation layer 142 to the top of the protrusion portion 144). The ratio of the height H2 to the height H1 (i.e., H2/H1) can be adjusted, so as to provide a better sidewall protection for the metal pillar bump 181. However, the top of the protrusion portion 144 may be below the bottom surface of the contact region 183, so as to maintain a better electrical contact between the contact region 183 and the external conductive feature. In some embodiments, the maximum height H2 of the passivation layer 142 with the protrusion portion 144 can be adjusted by controlling the thickness of the formed polymer-containing material 140 prior to the formation of the tape layer 150 (as indicated in FIG. 1G). For example, the ratio of the height H2 to the height H1 (i.e., H2/H1) can be adjusted in a range from about 12% to about 95%. Therefore, the reliability of the metal pillar bump 181 can be increased, while increasing the electrical performance of the semiconductor device structure.

Figure 2B:
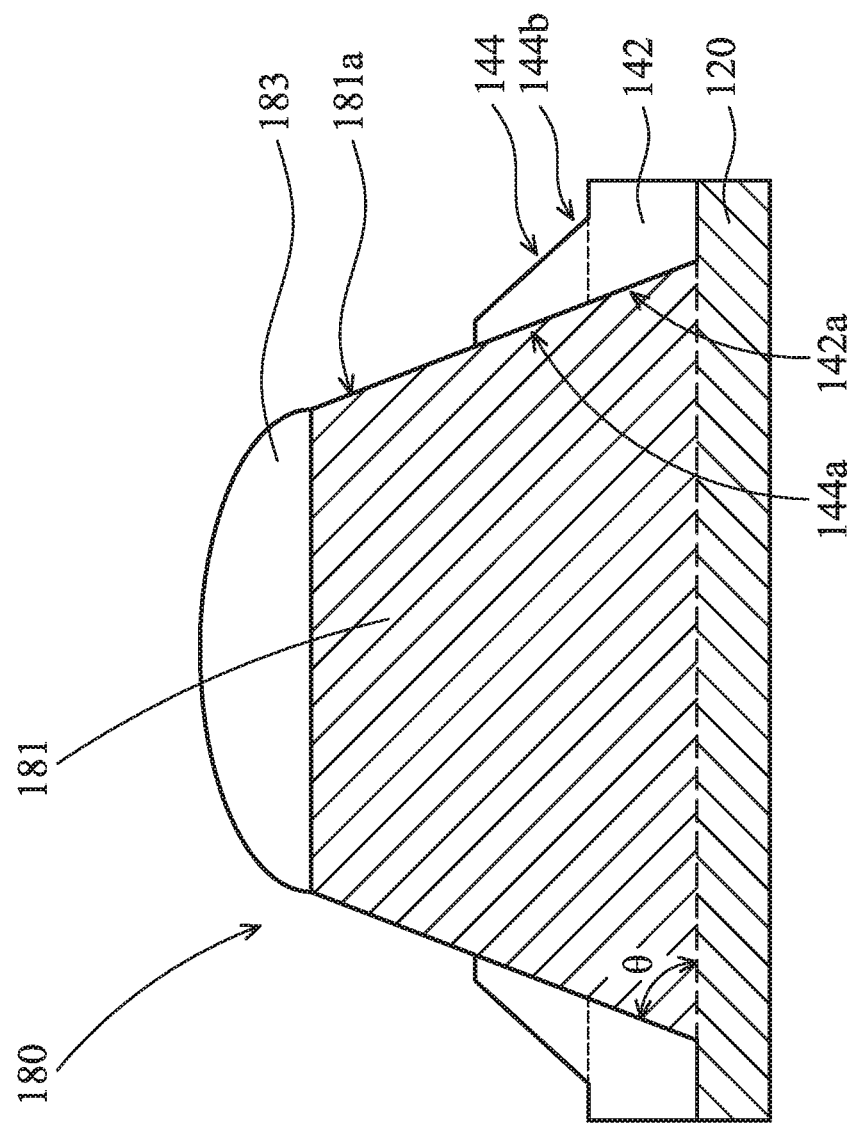
FIG. 2B is a cross-sectional view of a conductive bump structure, in accordance with some embodiments.
Figure 2C:
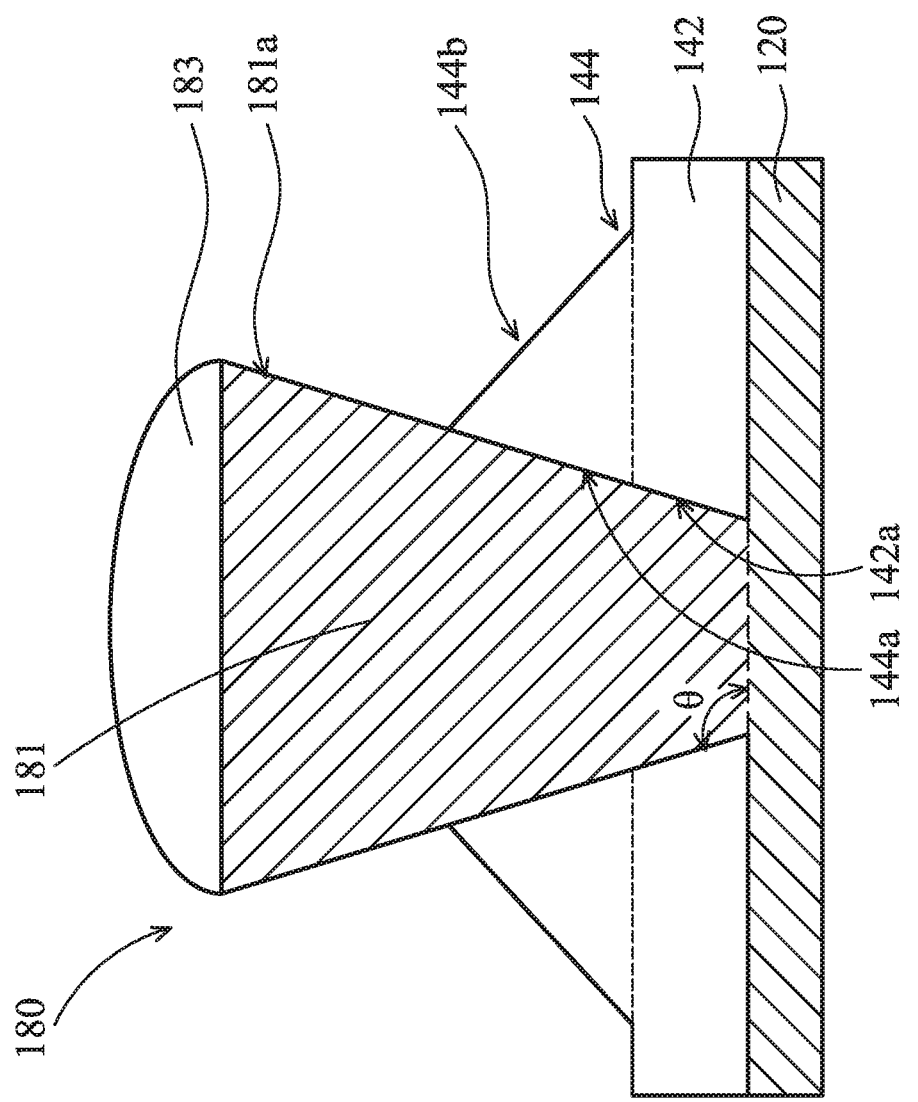
FIG. 2C is a cross-sectional view of a conductive bump structure, in accordance with some embodiments.

FIG. 2A is an enlarged cross-sectional view of the region 200 in FIG. 1H, in accordance with some embodiments. In FIG. 2A, a conductive bump structure 180 including the metal pillar bump 181 is illustrated. In some embodiments, an angle θ between the linear sidewall 181a of the metal pillar bump 181 and the bottom surface 181b of the metal pillar bump 181 is substantially equal to 90°. In those cases, the metal pillar bump 181 can be formed with a substantially perpendicular sidewall profile, so as to enhance the structural strength of the metal pillar bump 181. However, many variations and/or modifications can be made to embodiments of the disclosure. FIGS. 2B and 2C respectively illustrate a cross-sectional view of a conductive bump structure 180, in accordance with some embodiments. More specifically, an angle θ between the linear sidewall 181a of the metal pillar bump 181 and the bottom surface 181b of the metal pillar bump 181 may be in a range from about 5° to about 150°. As shown in FIG. 2B, the angle θ is less than 90°, in accordance with some embodiments. Similar to the embodiment shown in FIG. 2A, the structural strength of the metal pillar bump 181 is enhanced. Moreover, as shown in FIG. 2C, the angle θ is greater than 90°, in accordance with some embodiments. In those cases, the protrusion portion 144 not only provides a sidewall protection for the metal pillar bump 181, but also provides a mechanical support for the metal pillar bump 181 to enhance the structural strength of the metal pillar bump 181.

Although FIGS. 1A to 1H illustrate the formation of a semiconductor device structure with a single-level PPI layer including the metal layers 120, embodiments of the disclosure are not limited thereto. Many variations and/or modifications can be made to embodiments of the disclosure.

Figure 3A:
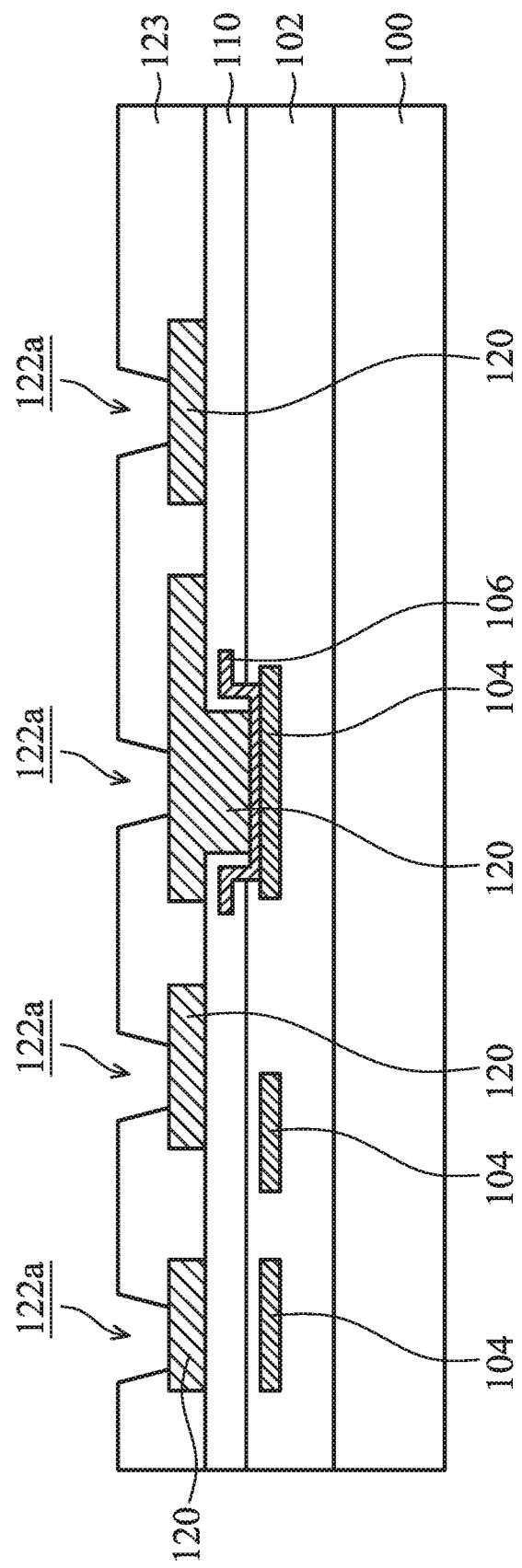
FIGS. 3A to 3G are cross-sectional views of various stages of forming a semiconductor device structure, in accordance with some embodiments.

FIGS. 3A to 3G are cross-sectional views of various stages of forming a semiconductor device structure with a multi-level PPI structure, in accordance with some embodiments. A structure similar to the structure shown in FIG. 1C is provided or formed, as shown in FIG. 3A in accordance with some embodiments. Unlike to FIG. 1C, the metal layers 120 (or referred to as interconnect layers) are formed by a deposition process without using a seed layer. The formation method may include sputtering, printing, and commonly used chemical vapor deposition (CVD) methods. In some other embodiments, the metal layers 120 are formed by a plating process, for example, an electro-chemical plating (ECP) process, which is carried out by using a seed layer (not shown) below the metal layers 120 as an electrode layer, as per the method shown in FIGS. 1B and 1C.

Afterwards, a passivation structure 123 is formed over the passivation layer 110 to cover the metal layers 120. Similar to the passivation structure 110, the passivation structure 123 may be formed of a single layer or include multiple layers. For example, the passivation structure 123 is formed of a single layer and is referred to as a passivation layer. In some embodiments, the passivation layer 123 is made of a non-organic material, such as silicon oxide, un-doped silicate glass (USG), silicon oxynitride, solder resist (SR), silicon nitride, silicon carbide, hexamethyldisilazane (HMDS), another suitable material, or a combination thereof. In some other embodiments, the passivation layer 123 is made of a polymer-containing material, such as epoxy, polyimide, polybenzoxazole (PBO), benzocyclobutene (BCB), silicone, acrylates, siloxane, or the like, although other relatively soft, often organic, dielectric materials can also be used. Afterwards, the passivation layer 123 is patterned to form openings 123a exposing portions of the metal layers 120.

Multiple deposition, coating, and/or etching processes may be used to form the passivation layer 123 with the openings 123a. For example, a chemical vapor deposition (CVD) process or a spin coating process may be used to form the passivation layer 123. Afterwards, an etching process, such as a dry etching process, may be used to form the openings 123a. It is noted that if the metal layers 120 are formed by a plating process using a seed layer as an electrode layer, this seed layer that is uncovered by the subsequently formed metal layers 120 is removed prior to the formation of the passivation layer 123.

Figure 3B:
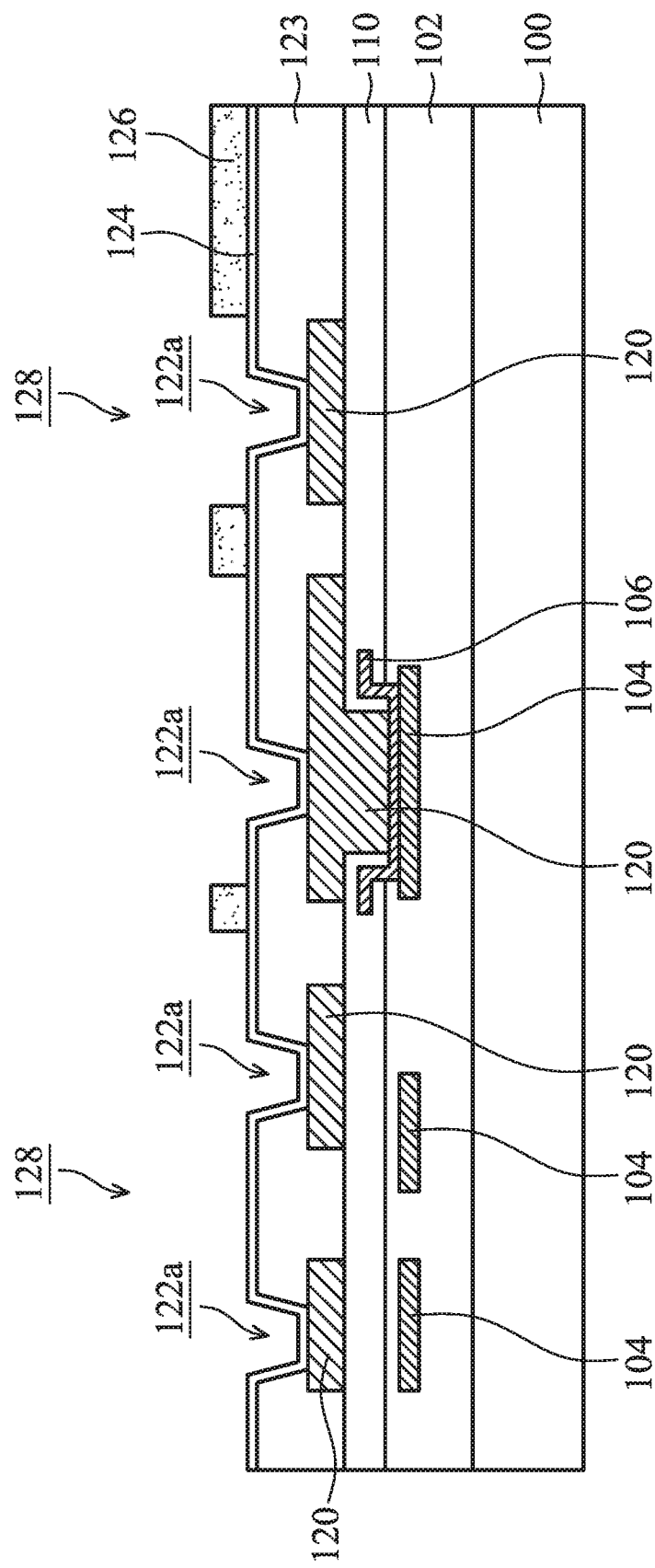
Figure 3C:
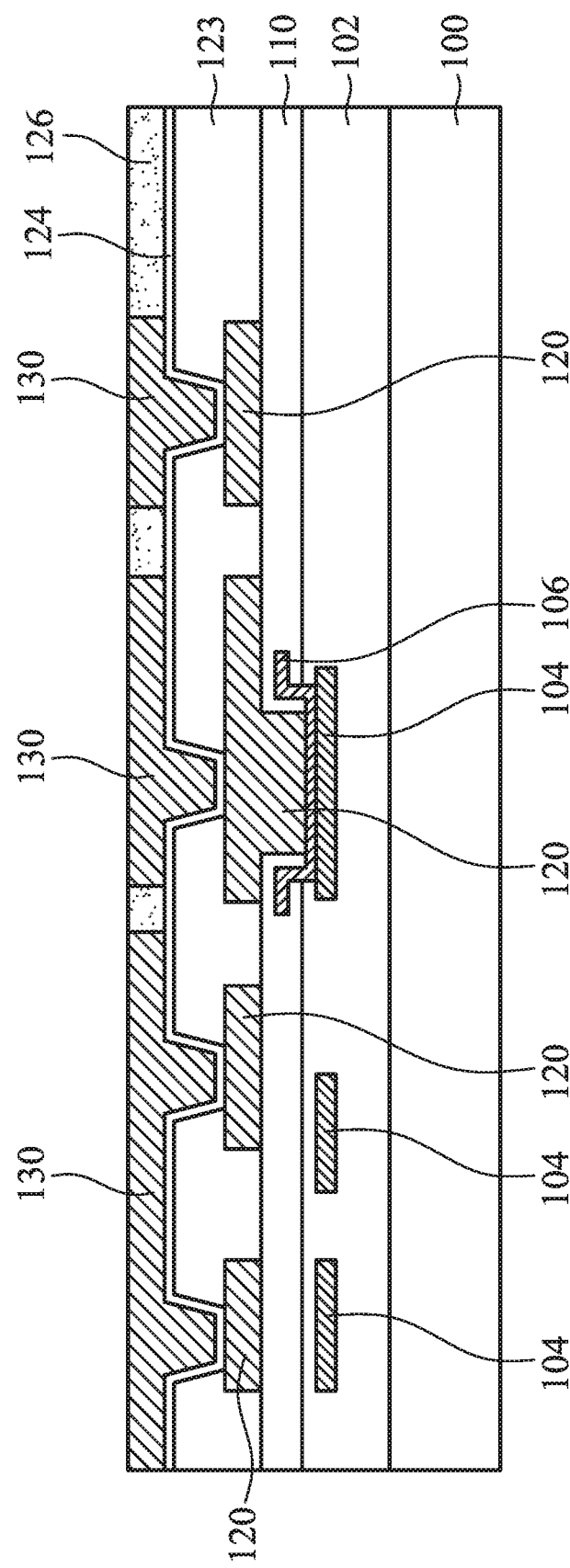

FIGS. 3B and 3C illustrate the formation of a post-passivation interconnect (PPI) layer including one or more metal layers 130 (as indicated in FIG. 3C), in accordance with some embodiments. The PPI layer including one or more metal layers 130 is electrically connected to the underlying PPI layer (which including one or more metal layers 120) through the openings 123a (as indicated in FIG. 1B) in the passivation layer 123.

As shown in FIG. 3B, a seed layer 124 conformally covers the top surface of the passivation layer 123 and extends on the sidewall and the bottom of each opening 122a of the passivation layer 123, so as to be in contact with the top surface of the metal layers 120. The material and the formation method of the seed layer 124 may be the same as or similar to those of the seed layer 112 shown in FIG. 1B. Afterwards, a patterned masking layer 126 is formed over the seed layer 112 to assist in the subsequent formation of the metal layers 130 (as indicated in FIG. 3C). The patterned masking layer 116 includes multiple openings that expose portions of the seed layer 124. Those openings of the patterned masking layer 126 define positions for the subsequent formed metal layers 130. The material and the formation method of the patterned masking layer 126 may be the same as or similar to those of the patterned masking layer 116 shown in FIG. 1B.

As shown in FIG. 3C, those openings of the patterned masking layer 126 are partially or fully filled with a conductive material layer, so as to form the metal layers (or the interconnect layers) 130. In some embodiments, a metal layer (such as a copper (Cu) layer) is formed over the seed layer 124 to partially fill each of the openings of the patterned masking layer 116, so that metal layers 130 are partially cover the seed layer 124. The formation method may include sputtering, printing, plating, electroless plating, and commonly used CVD methods. In some embodiments, a plating process, for example, an ECP process is carried out by using the seed layer 124 below the metal layers 130 as an electrode layer, so as to form the metal layers 130.

Figure 3D:
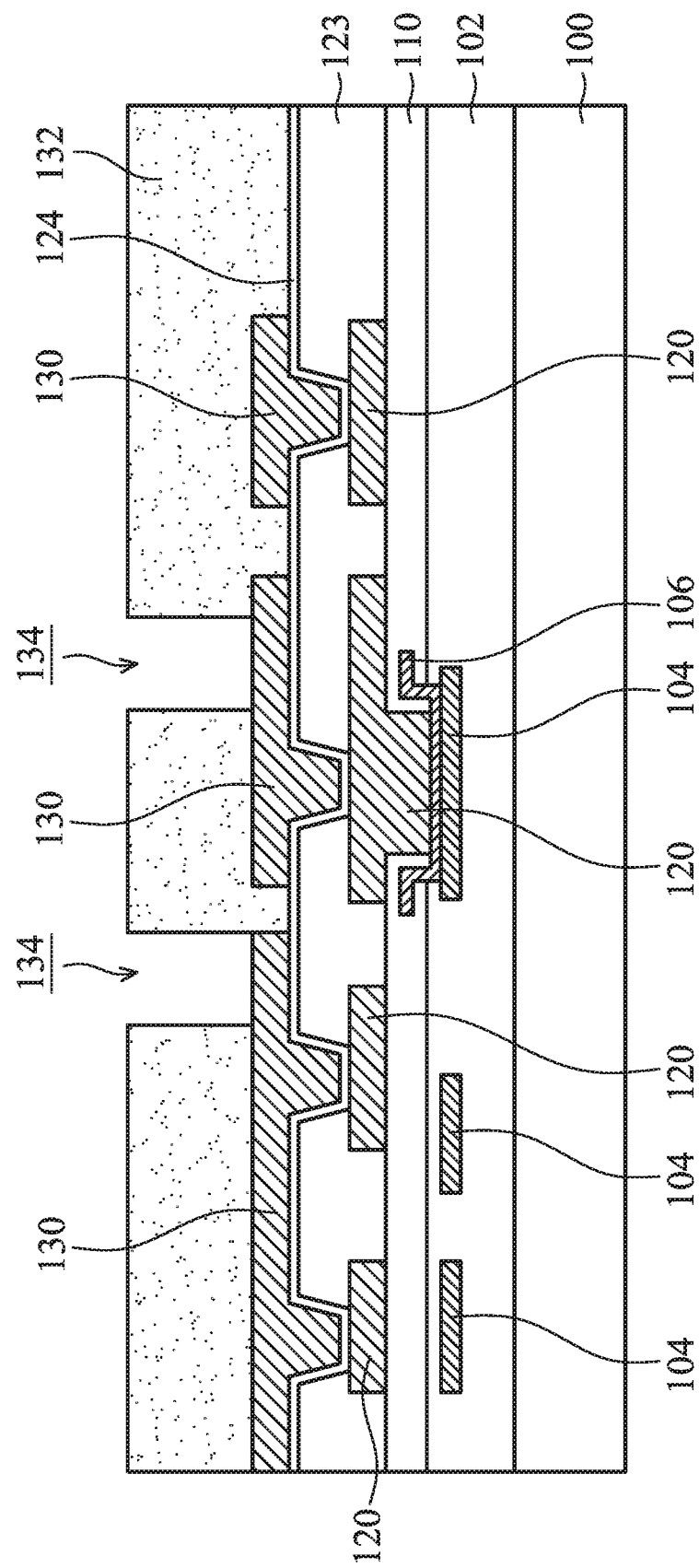
Figure 3E:
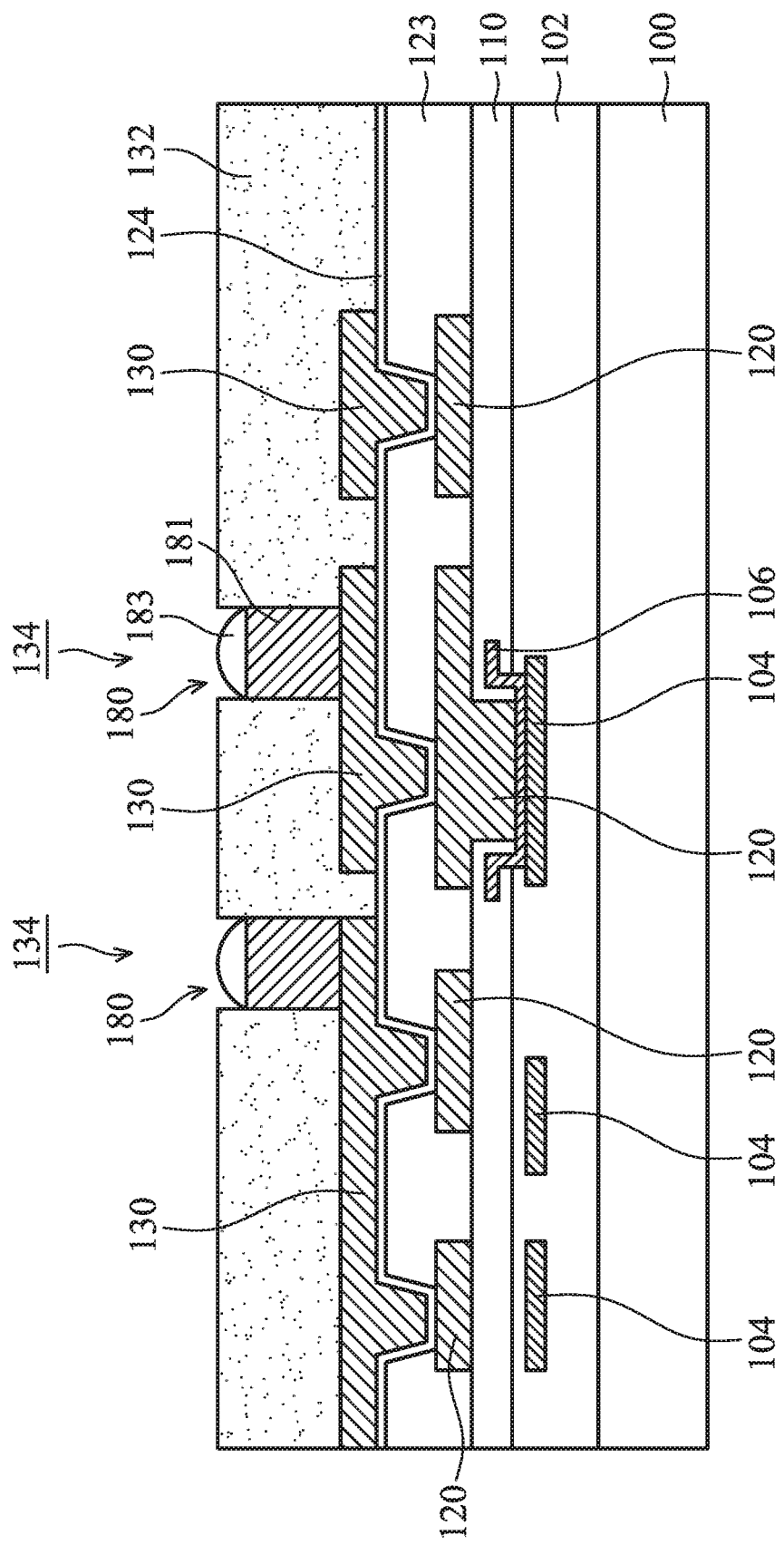

FIGS. 3D and 3E illustrate the formation of a conductive bump structure 180 including a metal pillar bumps 181 and a contact region 183 (as indicated in FIG. 3E), in accordance with some embodiments. As shown in FIG. 3D, the patterned masking layer 126 is removed to expose the seed layer 124 and the metal layers 130. The material, the formation method, and the removal method of the patterned masking layer 126 may be the same as or similar to those of the patterned masking layer 116 shown in FIGS. 1B to 1D. Afterwards, a patterned masking layer 122 is formed over the seed layer 112 and the metal layers 120 to assist in the subsequent formation of the metal pillar bumps 181 (as indicated in FIG. 3E). Similar to the patterned masking layer 126, the patterned masking layer 132 includes multiple openings that expose portions of the metal layers 130. Those openings of the patterned masking layer 132 define positions for the subsequent formed metal pillar bumps 181. The material, the patterning method, the removal of the masking layer 132 may be the same as or similar to those of the masking layer 126.

As shown in FIG. 3E, each of the openings of the patterned masking layer 132 is partially or fully filled with a conductive bump structure 180. More specifically, a metal layer (such as a copper (Cu), gold (Au) or silver (Ag) layer) is formed over each of the metal layers 130 to partially fill each of the openings of the patterned masking layer 132. In some embodiments, a plating process, for example, an ECP process is carried out by using the seed layer 124 below the metal layers 130 as an electrode layer, so as to form the metal pillar bumps 181. In those cases, the metal pillar bump 181 and the metal layer 130 under the correspondingly metal pillar bump 181 are formed by using the same electrode layer (i.e., the seed layer 124) for respective plating processes. Accordingly, the formations of the metal pillar bump 181 and the metal layer 130 can be simplified, thereby reducing the fabrication cost and processing time of the subsequent formed semiconductor device structure.

Afterwards, the contact region 183 (e.g., a metal contact region) is formed over a corresponding metal pillar bump 181, in accordance with some embodiments. In some embodiments, contact region 183 is a metal contact region, which includes a solder material layer and is formed in a plating process. Afterwards, the contact region 183 may then go through a reflow process, so as to form the conductive bump structure 180 (which is serves as an external connector for external conductive feature (not shown)) in each opening of the patterned masking layer 132.

Figure 3F:
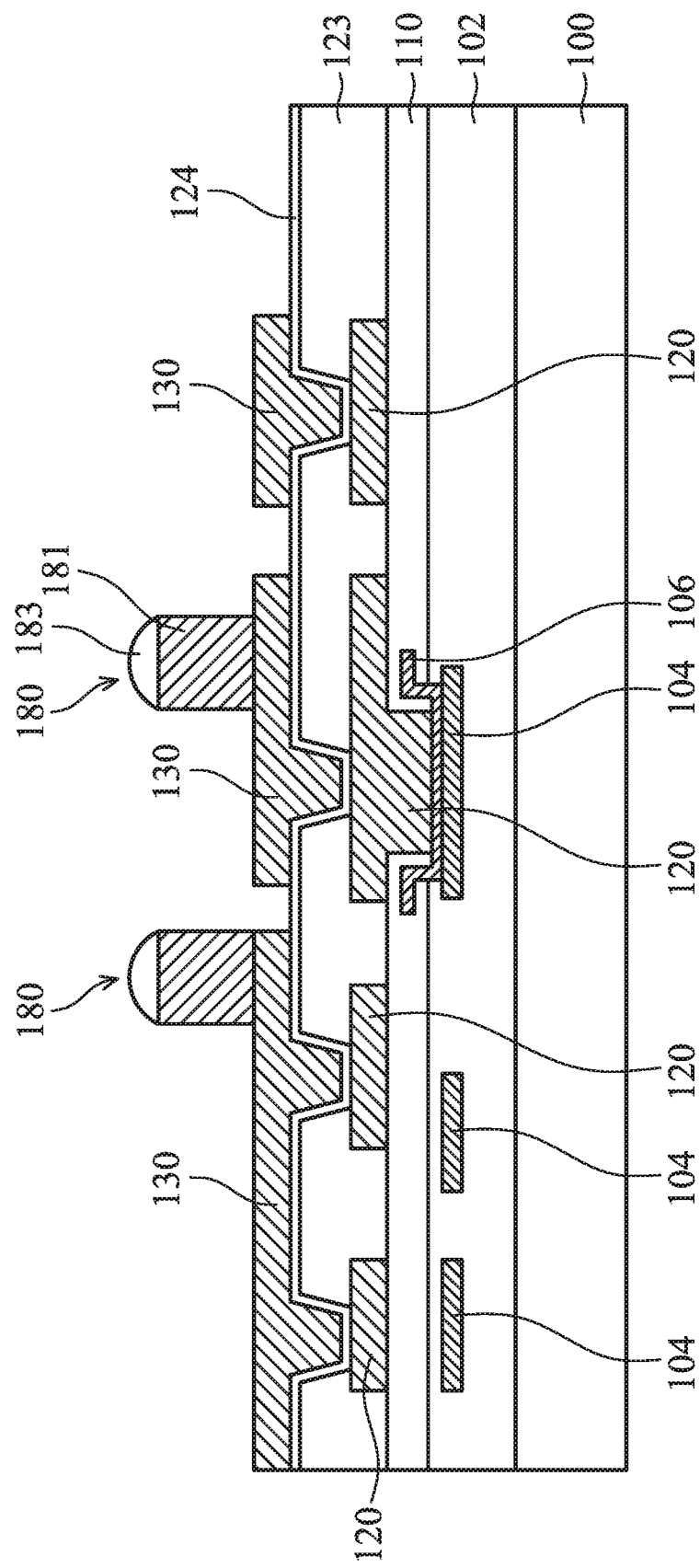

Similarly, the patterned masking layer 132 is removed to expose the seed layer 124, the metal layers 130, and the conductive bump structure 180, as shown in FIG. 3F in accordance with some embodiments. The method for removal of the patterned masking layer 132 can be the same as or similar to that of the patterned masking layer 126.

Figure 3G:
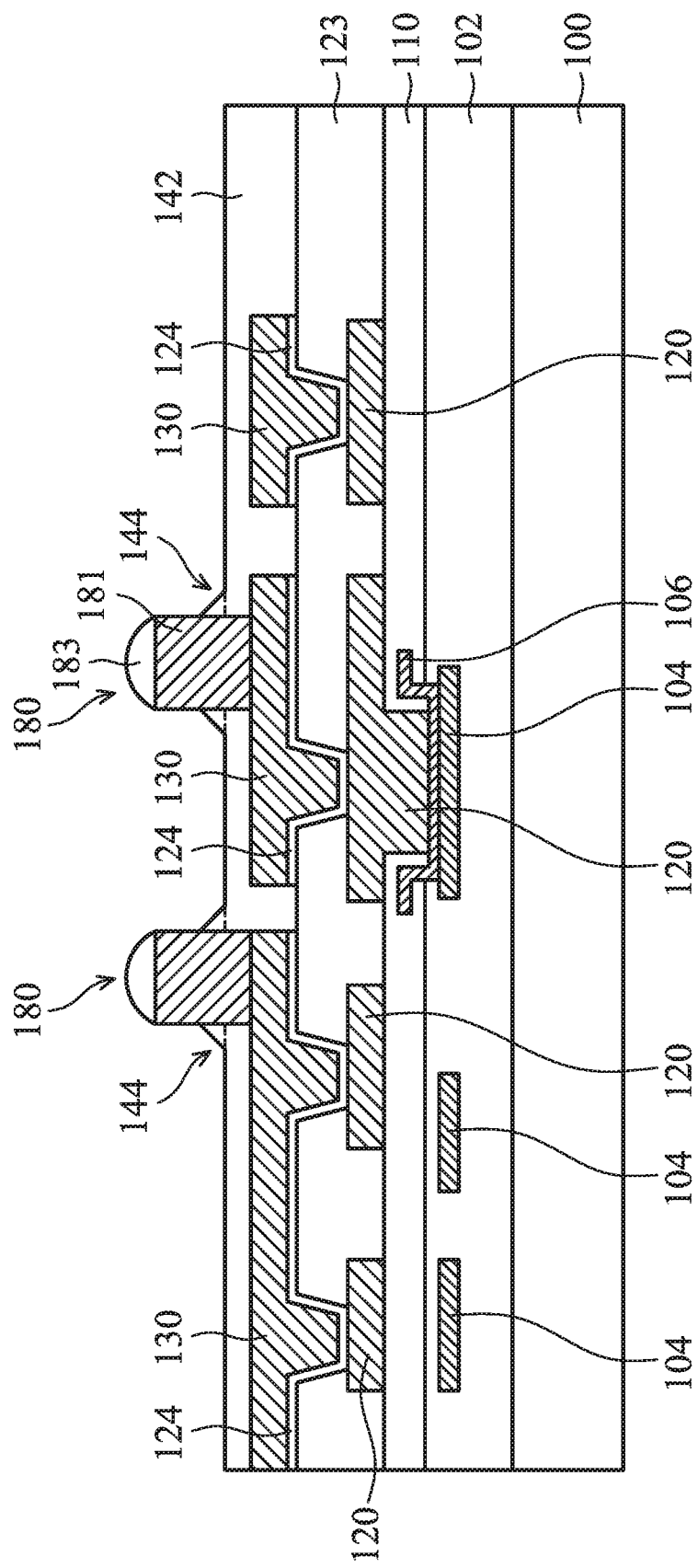

After the patterned masking layer 132 is removed, the exposed portions of the seed layer 124 that are uncovered by the metal layers 130 are removed by an etching process, so as to expose the passivation layer 123, as shown in FIG. 3G in accordance with some embodiments.

Afterwards, a passivation layer 142 with protrusion portions 144 is formed over the metal layers 130, in accordance with some embodiments. The passivation layer 142 with protrusion portions 144 serves an insulating protective structure for the conductive bump structures 180. More specifically, the insulating protective structure is formed over the metal layers 130 to cover a sidewall of each metal pillar bump 181. The protrusion portions 144 of the insulating protective layer extend from a top surface of the passivation layer 142 (which is also referred to as an insulating protective layer) and surround the sidewall of the corresponding metal pillar bumps 181.

In some embodiments, the material and the formation method used for the passivation layer 142 with the protrusion portions 144 are described in the embodiments shown in FIGS. 1G and 1H, and herein are not repeated. Also, the shape of the metal pillar bump 181 and the configurations of the protrusion portions 144 and the metal pillar bump 181 are described in the embodiments shown in FIGS. 2A, 2B, and 2C, and herein are not repeated.

Although the semiconductor device structure shown in FIG. 3G includes the passivation structure 123 formed of a single layer, embodiments of the disclosure are not limited thereto. Many variations and/or modifications can be made to embodiments of the disclosure.

Figure 4:
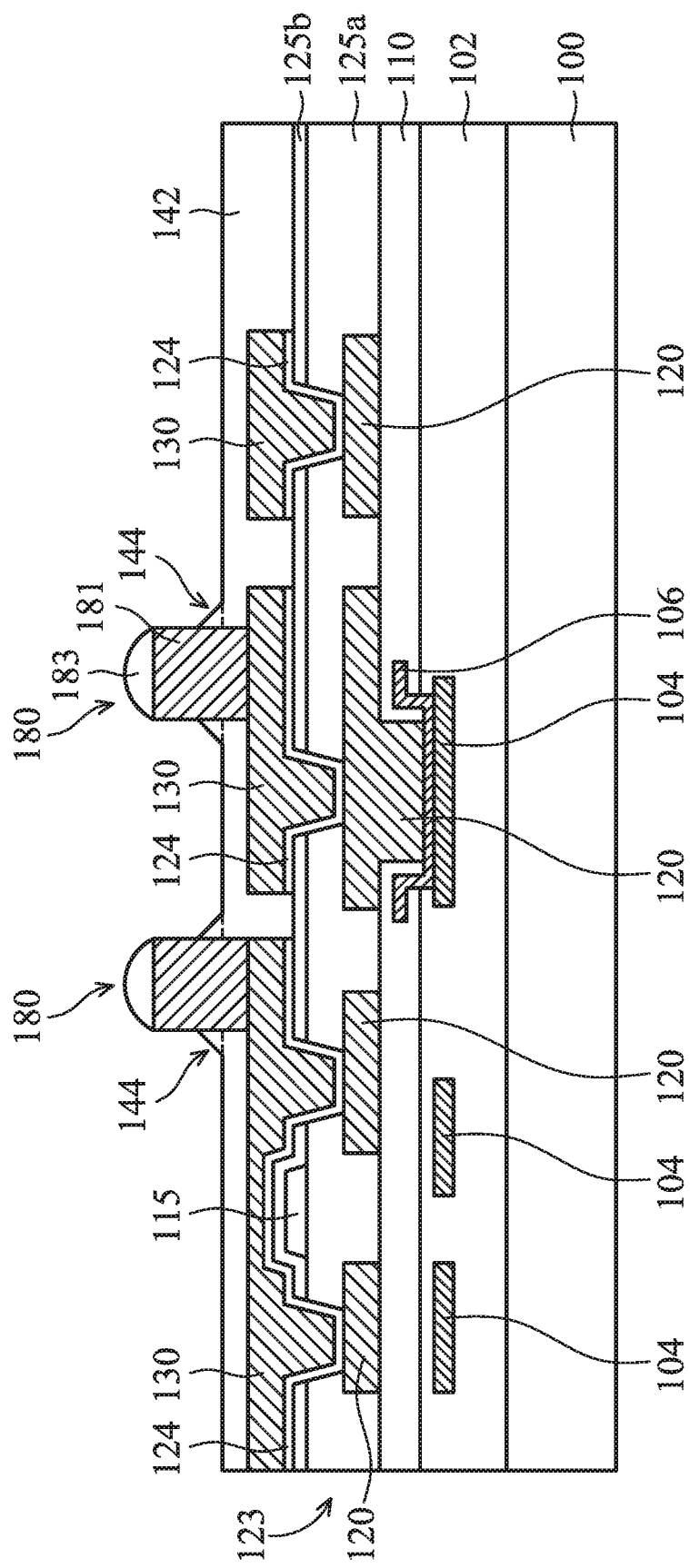
FIG. 4 is a cross-sectional view of a semiconductor device structure, in accordance with some embodiments.

FIG. 4 shows a cross-sectional representation of a semiconductor device structure including a passivation structure, in accordance with some embodiments. The semiconductor device structure is similar to the semiconductor device structure shown in FIG. 3G, expect that the passivation structure 123 is formed of multiple layers and a passive device 115 is embedded in the passivation structure 123. More specifically, the passivation structure 123 include a first passivation layer 125a over the passivation layer 110 to cover the metal layers 120, and a second passivation layer 125b over the first passivation layer 125a. The first passivation layer 125a and the second passivation layer 125b may be made of the same material or different materials. For example, the first passivation layer 125a and the second passivation layer 125b may be made of a non-organic material, such as silicon oxide, un-doped silicate glass (USG), silicon oxynitride, solder resist (SR), silicon nitride, silicon carbide, hexamethyldisilazane (HMDS), another suitable material, or a combination thereof. In some other embodiments, the first passivation layer 125a and the second passivation layer 125b may be made of a polymer-containing material, such as epoxy, polyimide, polybenzoxazole (PBO), benzocyclobutene (BCB), silicone, acrylates, siloxane, or the like, although other relatively soft, often organic, dielectric materials can also be used.

In some embodiments, the passive device 115 is formed over the first passivation layer 125a before the second passivation layer 125b is formed, so that the passive device 115 is covered by the second passivation layer 125b. In some embodiments, the passive device 115 is an integrated passive device (IPD), such as a capacitor or an inductor. For example, the passive device 115 may be an inductor including a magnetic material, such as, but not limited to, cadmium-zinc-telluride (CZT).

Embodiments of the disclosure form a semiconductor device structure having a metal layer and a metal pillar bump over the metal layer. Sidewalls of the metal layer and the metal pillar bump are covered by a passivation layer. The metal layer and the metal pillar bump are successively and respectively formed by using the same seed layer as an electrode layer in a first plating process and an electrode layer in a second plating process. As a result, the processes for formation of the metal pillar bump can be simplified, thereby reducing the fabrication cost and processing time of the semiconductor device structure. Moreover, the passivation layer is formed prior to the formation of the metal pillar bump. As a result, there is no need to pattern the passivation layer in order to form a space for placement of the metal pillar bump. Therefore, the processes for formation of the passivation layer can be simplified, thereby reducing the fabrication cost and processing time of the semiconductor device structure further. Moreover, the formed passivation layer includes a protrusion portion surrounding the sidewall of the metal pillar bump. The protrusion portion prevents the sidewall of the metal pillar bump from damage due to the stress induced in subsequent processes. As a result, the reliability of the metal pillar bump can be increased, thereby increasing the electrical performance of the semiconductor device structure. In addition, the metal pillar bump can be formed with a linear sidewall profile, so as to enhance the structural strength of the metal pillar bump. Therefore, the reliability of the metal pillar bump can be increased further.

In some embodiments, a method of forming a semiconductor device structure is provided. The method includes forming a seed layer to cover a first passivation layer over a semiconductor substrate. The method further includes forming a metal layer to partially cover the seed layer by using the seed layer as an electrode layer in a first plating process and forming a metal pillar bump over the metal layer by using the seed layer as an electrode layer in a second plating process. The method also includes forming a second passivation layer over the metal layer. The second passivation layer includes a protrusion portion extending from the top surface of the second passivation layer and surrounding a sidewall of the metal pillar bump.

In some embodiments, a method of forming a semiconductor device structure is provided. The method includes forming a passivation structure to cover a first interconnect layer that is electrically connected to a pad over a semiconductor substrate. The method further includes forming a second interconnect layer over and through the passivation structure by a first plating process, so that the second interconnect layer is electrically connected to the first interconnect layer. The method also includes forming a metal pillar bump over the second interconnect layer by a second plating process. In addition, the method includes forming an insulating protective layer over the second interconnect layer to cover a sidewall of the metal pillar bump. The insulating protective layer includes a protrusion portion extending from a top surface of the insulating protective layer and surrounding the sidewall of the metal pillar bump.

In some embodiments, a semiconductor device structure is provided. The semiconductor device structure includes a semiconductor substrate and a passivation structure formed over the semiconductor substrate. The semiconductor device structure further includes a first interconnect layer over and through the passivation structure. The semiconductor device structure also includes a metal pillar bump over the first interconnect layer. In addition, the semiconductor device structure includes an insulating protective layer over the first interconnect layer to cover a sidewall of the metal pillar bump. The insulating protective layer is extended to cover a sidewall of the first interconnect layer and includes a protrusion portion extending from a top surface of the insulating protective layer and surrounding the sidewall of the metal pillar bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, comprising:
   forming a seed layer to cover a first passivation layer over a semiconductor substrate;
   forming a metal layer to partially cover the seed layer by using the seed layer as an electrode layer in a first plating process;
   forming a metal pillar bump over the metal layer by using the seed layer as an electrode layer in a second plating process;
   forming a second passivation layer over the metal layer to cover a sidewall of the metal pillar bump, wherein the second passivation layer comprises a protrusion portion extending from a top surface of the second passivation layer and surrounding the sidewall of the metal pillar bump; and
   forming a solder material layer over the metal pillar bump before the second passivation layer is formed.

2. The method as claimed in claim 1, wherein the formation of the second passivation layer comprises:
   forming a polymer-containing material over the metal layer and surrounding the metal pillar bump;
   forming a tape layer over the polymer-containing material;
   pressing the polymer-containing material using the tape layer as a buffer layer;
   removing the tape layer to expose the polymer-containing material; and
   curing the exposed polymer-containing material.

3. The method as claimed in claim 1, wherein the sidewall of the metal pillar bump has a linear profile extending from a bottom surface of the metal pillar bump to a top surface of the metal pillar bump, and wherein the protrusion portion has a first sidewall with a tapered profile.

4. The method as claimed in claim 3, wherein an angle between the sidewall of the metal pillar bump and the bottom surface of the metal pillar bump is in a range from about 5° to about 150°.

5. The method as claimed in claim 3, wherein the protrusion portion has a second sidewall aligned with the sidewall of the metal pillar bump and a sidewall of the second passivation layer below the protrusion portion.

6. The method as claimed in claim 1, wherein a sidewall of the metal layer is covered by the second passivation layer.

7. The method as claimed in claim 1, further comprising:
forming a second metal layer to partially cover the seed layer by using the seed layer as the electrode layer in the first plating process; and
forming a second metal pillar bump over the second metal layer by using the seed layer as the electrode layer in the second plating process, wherein a sidewall of the second metal layer is aligned with a sidewall of the second metal pillar bump.

8. A method of forming a semiconductor device structure, comprising:
forming a seed layer over a passivation structure and a first metal layer exposed from an opening of the passivation structure;
forming a second metal layer in the opening and over the passivation structure by using the seed layer as an electrode layer in a first plating process;
forming a metal pillar bump over the second metal layer by using the seed layer as an electrode layer in a second plating process; and
forming an insulating protective layer over the passivation structure to cover a sidewall of the second metal layer and a sidewall of the metal pillar bump.

9. The method as claimed in claim 8, wherein the seed layer is in contact with the first metal layer and the second metal layer.

10. The method as claimed in claim 8, wherein the formation of the insulating protective layer comprises:
successively forming a polymer-containing material and a tape layer over the second metal layer and surrounding the metal pillar bump;
pressing the polymer-containing material using the tape layer as a buffer layer;
removing the tape layer to expose the polymer-containing material; and
curing the exposed polymer-containing material.

11. The method as claimed in claim 10, wherein polymer-containing material is extended to cover a sidewall of the second interconnect metal layer.

12. The method as claimed in claim 8, wherein the sidewall of the metal pillar bump has a linear profile extending from a bottom surface of the metal pillar bump to a top surface of the metal pillar bump, and an angle between the sidewall of the metal pillar bump and the bottom surface of the metal pillar bump is in a range from about 5° to about 150°.

13. The method as claimed in claim 8, wherein the insulating protective layer comprises a protrusion portion extending from a top surface of the insulating protective layer and surrounding the sidewall of the metal pillar bump.

14. The method as claimed in claim 13, wherein an interface between the metal pillar bump and the protrusion portion and an interface between the metal pillar bump and a portion of the insulating protective layer below the protrusion portion are substantially aligned with each other.

15. The method as claimed in claim 8, wherein the passivation structure comprises:
a first passivation layer over the first interconnect layer; and
a second passivation layer over the first passivation layer.

16. A method of forming a semiconductor device structure, comprising:
forming a seed layer over a conductive feature;
forming a metal interconnect layer over the conductive feature by using the seed layer as an electrode layer in a first plating process;
forming a metal pillar bump over the metal interconnect layer by using the seed layer as an electrode layer in a second plating process, wherein an angle between the sidewall of the metal pillar bump and a bottom surface of the metal pillar bump is in a range from about 5° to about 150°; and
forming a passivation layer surrounding a sidewall of the metal pillar bump, wherein the passivation layer comprises a protrusion portion extending from a top surface of the passivation layer and wherein the protrusion portion has a sidewall with a tapered profile.

17. The method as claimed in claim 16, wherein the conductive feature comprising a metal pad and the method further comprises:
forming a second passivation layer over the metal pad; and
forming a second interconnect layer passing through the second passivation layer and over the metal pad prior to the formation of the seed layer, wherein the second interconnect layer is in direct contact with the seed layer.

18. The method as claimed in claim 16, wherein the conductive feature comprising a metal pad and the method further comprises:
forming a second passivation layer over the metal pad prior to the formation of the seed layer, wherein the seed layer passes through the second passivation layer and is in direct contact with the metal pad.

19. The method as claimed in claim 16, wherein the passivation layer comprises a polymer-containing material.

20. The method as claimed in claim 16, wherein the metal pillar bump is in direct contact with the metal interconnect layer.

* * * * *